(12) United States Patent
Sunil et al.

(10) Patent No.: US 7,655,549 B2
(45) Date of Patent: Feb. 2, 2010

(54) METHOD FOR DEPOSITING A METAL GATE ON A HIGH-K DIELECTRIC FILM

(75) Inventors: Wickramanayaka Sunil, Tokyo (JP); Motomu Kosuda, Tokyo (JP); Naoki Yamada, Tokyo (JP); Naomu Kitano, Tokyo (JP)

(73) Assignee: Canon Anelva Corporation, Tokyo (JP)

( * ) Notice: Subject to any disclaimer, the term of this patent is extended or adjusted under 35 U.S.C. 154(b) by 130 days.

(21) Appl. No.: 11/347,256

(22) Filed: Feb. 6, 2006

(65) Prior Publication Data
US 2006/0194396 A1    Aug. 31, 2006

(30) Foreign Application Priority Data
Feb. 25, 2005  (JP) ............................. 2005-051340

(51) Int. Cl.
*H01L 21/3205* (2006.01)
*H01L 21/4763* (2006.01)
*H01L 21/31* (2006.01)
*H01L 21/469* (2006.01)

(52) U.S. Cl. ....................... 438/591; 438/785; 438/782; 257/E21.625

(58) Field of Classification Search ................. 438/591, 438/592, 785, 782
See application file for complete search history.

(56) References Cited

U.S. PATENT DOCUMENTS

| | | | |
|---|---|---|---|
| 5,376,223 A | 12/1994 | Salimian et al. | |
| 5,478,780 A | 12/1995 | Koerner et al. | |
| 5,587,039 A | 12/1996 | Salimian et al. | |
| 6,294,820 B1 * | 9/2001 | Lucas et al. | 257/412 |
| 6,391,727 B1 | 5/2002 | Park | |
| 6,624,093 B1 * | 9/2003 | Lyman et al. | 438/785 |
| 6,734,069 B2 | 5/2004 | Eriguchi | |
| 6,737,716 B1 | 5/2004 | Matsuo et al. | |
| 6,747,748 B2 | 6/2004 | Matsudo et al. | |

(Continued)

FOREIGN PATENT DOCUMENTS

JP    4-225223    8/1992

(Continued)

OTHER PUBLICATIONS

Kazutaka Honda et al., "Pulsed Laser Deposition and Analysis for Structural and Electrical Properties of $HfO_2$-$TiO_2$ Composite Films", Japanese Journal of Applied Physics, vol. 43, No. 4A, 2004, pp. 1571-1576.

(Continued)

*Primary Examiner*—Matthew C Landau
*Assistant Examiner*—Daniel Luke
(74) *Attorney, Agent, or Firm*—Buchanan, Ingersoll & Rooney, PC

(57) ABSTRACT

A method to improve a high-k dielectric film and metal gate interface in the fabrication of a MOSFET by depositing a metal gate on a high-k dielectric, the method includes annealing a substrate with a high-k dielectric film deposited thereon in a thermal annealing module and depositing a metal gate material on the annealed substrate in a metal gate deposition module, wherein the annealing step and the depositing step are carried out consecutively without a vacuum break.

20 Claims, 15 Drawing Sheets

U.S. PATENT DOCUMENTS

| | | | |
|---|---|---|---|
| 6,806,145 B2 * | 10/2004 | Haukka et al. | 438/287 |
| 6,858,524 B2 * | 2/2005 | Haukka et al. | 438/585 |
| 2003/0075740 A1 * | 4/2003 | Bai et al. | 257/216 |
| 2004/0217410 A1 * | 11/2004 | Meng et al. | 257/310 |
| 2005/0070123 A1 * | 3/2005 | Hirano | 438/778 |
| 2005/0227500 A1 | 10/2005 | Sugawara et al. | |
| 2005/0233526 A1 | 10/2005 | Watanabe | |
| 2005/0282369 A1 * | 12/2005 | Karabacak et al. | 438/584 |

FOREIGN PATENT DOCUMENTS

| | | |
|---|---|---|
| JP | 6-29248 | 2/1994 |
| JP | 9-148246 | 6/1997 |
| JP | 2000-232077 | 8/2000 |
| JP | 2000-243951 | 9/2000 |
| JP | 2001-237424 | 8/2001 |
| JP | 2002-118160 | 4/2002 |
| JP | 2002-184773 A | 6/2002 |
| JP | 2002-314074 | 10/2002 |
| JP | 2003-249497 A | 9/2003 |
| JP | 2006-237371 A | 9/2006 |
| WO | WO 03/088342 | 10/2003 |
| WO | WO 2004/008544 A1 | 1/2004 |

OTHER PUBLICATIONS

Heiji Watanabe et al., "Thermal Degradation of HfSiON Dielectrics Caused by TiN Gate Electrodes and Its Impact on Electrical Properties", The Japan Society of Applied Physics, vol. 45, No. 4B, 2006, pp. 2933-2938.

Japanese Office Action in corresponding Application No. 2005-051340 dated Apr. 13, 2009, and an English Translation thereof.

* cited by examiner (a)

(b)

PRIOR ART

PRIOR ART

METHOD FOR DEPOSITING A METAL GATE ON A HIGH-K DIELECTRIC FILM

CROSS-REFERENCE TO RELATED APPLICATIONS

This application claims priority of Japanese Patent Application No. 2005-51340, filed in Japan on Feb. 25, 2005, the entire contents of which are hereby incorporated by reference.

FIELD OF THE INVENTION

The present invention relates to a method for depositing a metal gate on a high-k dielectric film in the fabrication of metal-oxide-semiconductor field effect transistors (MOSFET). And, the present invention relates to a method for improving a high-k dielectric film and metal gate interface in the fabrication of MOSFET. Also, the present invention relates to a substrate treating system, which is suitable to be used in said methods.

BACKGROUND OF THE INVENTION

The elementary device of most of the complex integrated circuits (IC) fabricated on semiconductor substrates is a metal-oxide-semiconductor (MOS) transistor. These transistors are generally called metal-oxide-semiconductor field effect transistors (hereinafter referred to as MOSFET). FIG. 15 shows an example of a simple diagram of a MOSFET denoted by numeral 100. In FIG. 15, MOSFET 100 is comprised of a semiconductor 101, gate dielectric (gate oxide) 104, gate electrode 105, source region 102 and drain region 103. During its operation an electric field is applied to the channel region 107 below the gate dielectric 104 to switch the transistor on and off.

In order to increase the performance of integrated circuits (IC), the design rule or the smallest feature size of ICs are gradually reduced. With the shrink of design rule, new materials and deposition techniques are of importance. For example, the thickness of gate oxide ($t_{ox}$) reduces with the reduction of gate length ($G_L$) (denoted by numeral 106) with the relationship of $t_{ox}$=0.018 $G_L$. This is important to maintain a higher capacitance between semiconductor 101 and the gate electrode 105.

With respect to the thinning of gate oxide 104, conventional dielectric materials ($SiO_2$, SiON) are no longer applicable since very thin films of these materials show different electrical properties such as higher leakage current.

The gate dielectric (gate oxide) should be replaced with new dielectric materials of which the dielectric constant is higher than that of $SiO_2$. This facilitates to use thicker film without compensating the capacitance.

These higher dielectric constant materials are called high-k dielectrics. For example, $HfO_2$, HfSiO, HfAlO are considered as high-k dielectrics.

With the use of high-k dielectrics, conventional gate electrode material, such as poly-Si, also must be replaced with different materials due to two reasons. First is that poly-Si is not compatible with most high-k dielectrics. Second is that use of poly-Si causes a generation of depletion region at the poly-Si/high-k interface resulting in a higher equivalent oxide thickness (EOT) and a lower capacitance.

Pure metals, metal alloys, metal nitride or metal alloy nitrides are usually considered for a gate electrode to be used with high-k dielectrics.

At present, high-k and metal gate are fabricated with the procedure given in the following chart, for example.
1. clean Si substrates with diluted HF solution
2. dry the wafer in Nitrogen
3. deposit thermal $SiO_2$ (~1 nm)
4. deposit Hf (or $HfO_2$)
5. thermal annealing
6. deposit metal gate
7. thermal annealing One may eliminate step 3 described in the above procedure, and instead, Hf or $HfO_2$ is directly deposited on surface-treated Si. Moreover, the above procedure is explained using $HfO_2$ as the high-k dielectric. However, one can select any other high-k material as the dielectric, for example, HfSiO, HfSiON, HfAlO etc.

FIG. 14 is a schematic diagram showing a CVD module 40 attached to a central wafer-handling platform 3 and wafer loading/unloading equipment-front-end module 13. CVD module 40 may be Metal Organic Chemical Vapor Deposition (MOCVD) module or Atomic Layer Deposition (ALD) module.

In MOCVD processes, metal-organic gases are used. There are two basic groups of metal-organic gases; for example, in depositing Hf-base dielectrics one can use i) halide-based gases such as $HfCl_4$ or ii) carbon-based gases such as $C_{16}H_{40}N_4Hf$ (Tetrakis-diethylamino hafnium).

In ALD depositions, two gases are alternatively introduced into the CVD module 40. When the first gas, which is usually called the precursor gas, is introduced into the CVD module 40, precursor molecules stick on the substrate surface. When the second gas is introduced into the CVD module 40, it reacts with surface-stick precursor molecules and forms a dielectric film. This procedure continues until a film with the desired thickness is formed.

Impurity contamination is the biggest problem in any CVD (ALD or MOCVD) processes.

For example, firstly, in MOCVD, halides or carbon contaminates the wafer. In ALD process also, carbon from precursor gas contaminates the film. Higher impurity concentration in the dielectric film causes higher leakage current, threshold voltage shift and reduction of electron mobility in the channel region 107 in MOSFET devices (FIG. 15).

Secondly, for any CVD (MOCVD or ALD) processes, wafer must be heated to a higher temperature, for example 400° C. The temperature uniformity on the substrate surface directly affects the film uniformity. Any temperature non-uniformity results in non-uniform dielectric film and thereby causes faulty MOSFET devices or a lower yield (number of good MOSFETs) per wafer.

Thirdly, lower throughput, particularly with the ALD method, limits the economic viability. In the ALD process, film grows with the switching of two gases so the deposition rate is slow. The required film thickness of high-k dielectric materials is usually 10-40 angstroms. When these deposition rates and film thicknesses are considered, the throughput is less than 10 wafers per hour.

Fourth, owing to the expensive precursors and lower utilization efficiency of precursors, CVD methods have a higher running cost. This also limits the economic viability of CVD methods.

OBJECTS AND SUMMARY

In the fabrication of high-k dielectric film and metal gates, the qualities of lower interface between Si and high-k dielectric film, and upper interface between high-k dielectric film and metal gates are of importance.

The upper interface quality particularly affects the electron mobility, threshold voltage ($V_{th}$) shift due to pinning effect.

To improve the electron mobility and minimize $V_{th}$ shift, the interface trap density must be lowered.

The interface trap density depends on high-k dielectric and metal gate material qualities as well as fabrication process.

Conventionally, after the thermal annealing of high-k dielectric, which is usually done in a separate annealing system, wafers are exposed to normal atmosphere until they are placed in metal gate deposition system.

Usually, high-k dielectrics show a better thermal stability, however, depending on the dielectric materials, they show different chemical properties after being exposed to normal atmosphere.

For example, an $SiO_2$ layer can be grown at the Si and high-k interface when $HfO_2$ is selected as the high-k, since oxygen diffuses through $HfO_2$ film. The thickness of this interface $SiO_2$ also varies depending on the time exposed to the normal atmosphere causing reliability issues.

If LaO or its alloys are used as high-k, moisture absorbs into the film when exposed to the atmosphere; this changes trap density in the film and interface. All these changes after being exposed to atmosphere cause a decrease of film quality and thereby the performance of end-product semiconductor devices is decreased.

Therefore, an object of the present invention is to provide a method for depositing a metal gate on a high-k dielectric film in the fabrication of metal-oxide-semiconductor field effect transistors (MOSFET) by which the qualities of high-k dielectric film and metal gate material are improved thereby electron mobility is improved and $V_{th}$ shift is minimized.

Also, another object of the present invention is to provide a method to improve high-k dielectric film and metal gate interface in the fabrication of MOSFET by which the interface trap density can be lowered thereby electron mobility is improved and $V_{th}$ shift is minimized.

A further object of the present invention is to provide a substrate treating system, which is suitable to be used in said methods.

In order to achieve the above-described objects, a first aspect of the present invention provides a method for depositing a metal gate on a high-k dielectric film in the fabrication of MOSFET comprising an annealing step annealing a substrate with high-k dielectric film deposited thereon in a thermal annealing module, and a depositing step depositing a metal gate material on said annealed substrate in a metal gate deposition module, wherein the annealing step and depositing step are carried out consecutively without a vacuum break.

This method is conducted by a substrate treating system comprising a wafer-handling platform including transfer means to transfer a substrate and a processing module connected to said wafer-handling platform, wherein said processing module includes at least a thermal annealing module and a metal gate deposition module, and said transfer means transfer the substrate between said wafer-handling platform and said processing module without a vacuum break.

A second aspect of the present invention provides a method for depositing a metal gate on a high k dielectric film in the fabrication of MOSFET comprising an annealing step annealing a substrate with high-k dielectric film deposited thereon in a thermal annealing module, a cooling step cooling said annealed substrate in a cooling module, and a depositing step depositing a metal gate material on said cooled substrate in a metal gate deposition module, wherein the annealing step, cooling step and depositing step are carried out consecutively without a vacuum break.

This method is conducted by a substrate treating system comprising a wafer-handling platform including transfer means to transfer a substrate and a processing module connected to said wafer-handling platform, wherein said processing module includes at least a thermal annealing module, a cooling module and a metal gate deposition module, and said transfer means transfer the substrate between said wafer-handling platform and said processing module without a vacuum break.

A third aspect of the present invention provides a method for depositing a metal gate on a high-k dielectric film in the fabrication of MOSFET comprising a first depositing step depositing a high-k dielectric film on a substrate in a high-k deposition module, an annealing step annealing said substrate on which high-k dielectric film is deposited in a thermal annealing module, a cooling step cooling said annealed substrate in a cooling module, and a second depositing step depositing a metal gate material on said cooled substrate in a metal gate deposition module wherein said first depositing step, annealing step, cooling step and second depositing step are carried out consecutively without a vacuum break.

This method is conducted by a substrate treating system comprising a wafer-handling platform including transfer means to transfer a substrate and processing module connected to said wafer-handling platform, wherein said processing module includes at least a thermal annealing module, a cooling module, a high-k deposition module, and a metal gate deposition module, and said transfer means transfer the substrate between said wafer-handling platform and said processing module without a vacuum break.

A fourth aspect of the present invention provides a method for depositing a metal gate on a high-k dielectric film in the fabrication of MOSFET comprising a first depositing step depositing a thin thermal $SiO_2$ film on a substrate in a thermal annealing module, a first cooling step cooling said substrate in a cooling module, a second depositing step depositing a high-k dielectric film on a substrate in a high-k deposition module, an annealing step annealing said substrate in a thermal annealing module, a second cooling step cooling said annealed substrate in a cooling module, and a third depositing step depositing a metal gate material on said cooled substrate in a metal gate deposition module, wherein the first depositing step, first cooling step, second depositing step, annealing step, second cooling step and third depositing step are carried out consecutively without a vacuum break.

This method is conducted by a substrate treating system comprising a wafer-handling platform including transfer means to transfer a substrate and processing module connected to said wafer-handling platform, wherein said processing module includes at least a thermal annealing module, a cooling module, a high-k deposition module, and a metal gate deposition module, and said transfer means transfer the substrate between said wafer-handling platform and said processing module without a vacuum break.

A fifth aspect of the present invention provides a method for depositing a metal gate on a high-k dielectric film in the fabrication of MOSFET according to any one of the before described first to fourth aspects of the present invention wherein a metal gate formed by said depositing step depositing a metal gate material comprises of a plural film stack, and after said metal gate is formed the substrate is further annealed consecutively in the thermal annealing module without a vacuum break.

In this depositing method, the before described plural film stack including different films, for example, a plural film stack including different films is laminated. And, by the annealing step, which is consecutively conducted after said metal gate material comprised of a plural film stack is formed, the metal stack materials are intermixed.

A sixth aspect of the present invention provides a method to improve high-k dielectric film and metal gate interface in the fabrication of MOSFET by depositing a metal gate on a high-k dielectric film according to any one method of the before described first to fifth aspect of the present invention.

A seventh aspect of the present invention provides a substrate treating system comprising a wafer-handling platform including transfer means to transfer a substrate and processing module connected to said wafer-handling platform; wherein said processing module includes at least a thermal annealing module and a metal gate deposition module, and said transfer means transfer the substrate between said wafer-handling platform and said processing module without a vacuum break.

An eighth aspect of the present invention provides a substrate treating system according to the seventh aspect of the present invention wherein said processing module further includes a cooling module and/or a high-k dielectric deposition module.

According to an embodiment of the present invention, an improved method of depositing a metal gate on a high-k dielectric film in the fabrication of MOSFET is provided by which the qualities of high-k dielectric film and metal gate material are improved, thereby the electron mobility is improved and $V_{th}$ shift is minimized.

Also, an improved method improving high-k dielectric film and metal gate interface in the fabrication of MOSFET is provided by which the interface trap density can be lowered, thereby the electron mobility is improved and $V_{th}$ shift is minimized.

Further, a substrate treating system which is suitable to be used in the before described methods is provided.

Integration of thermal annealing system and metal gate deposition system to a one wafer-handling platform improves the high-k dielectric film and metal gate interface properties and thereby improves electrical characteristics and device performance.

BRIEF DESCRIPTIONS OF THE DRAWINGS

FIGS. 7(a) to (d) show the procedure of film deposition and thermal annealing process.

Figure 8:
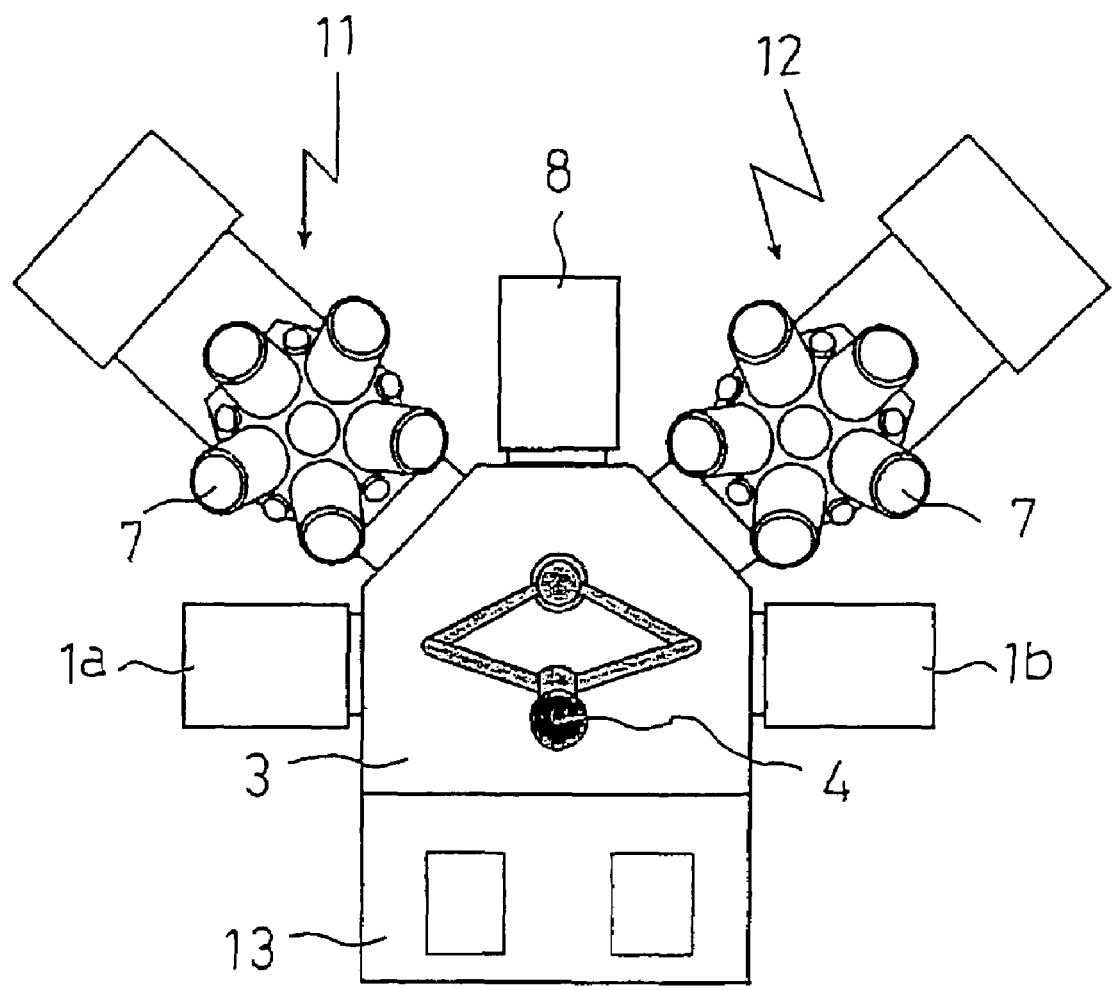

FIG. 8 shows a schematic diagram of another integrated system.

Figure 9:
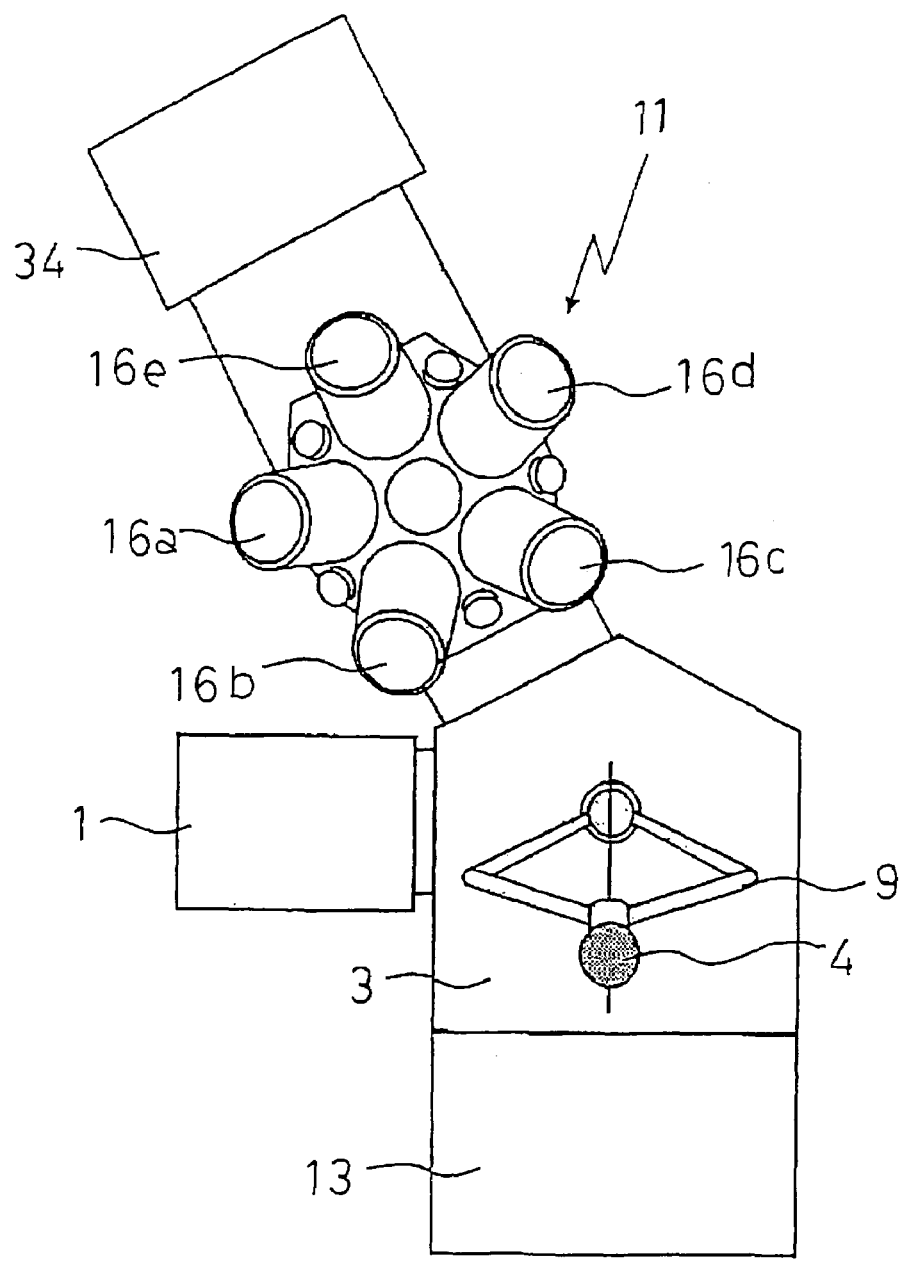

FIG. 9 shows a schematic diagram of another integrated system.

Figure 10:
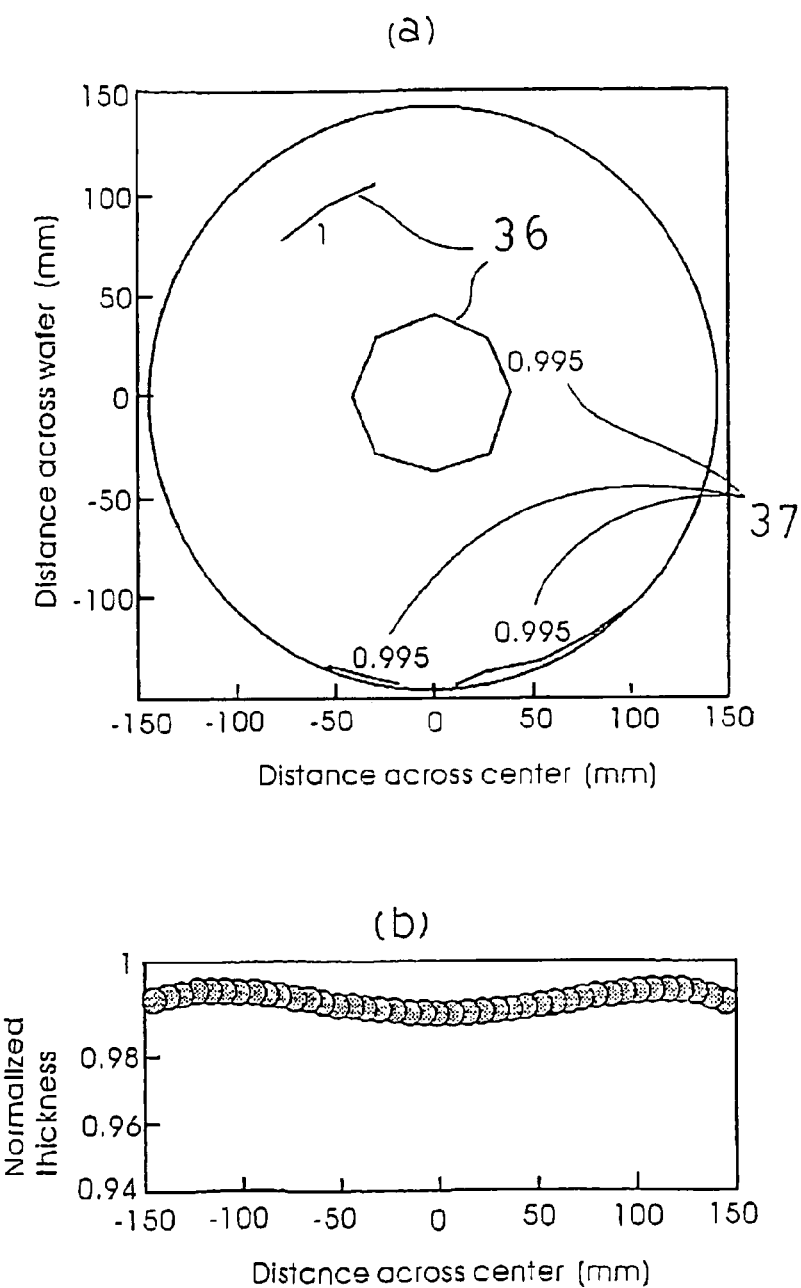

FIG. 10(a) shows uniform-counter lines of Hf film deposited on 300 mm wafer, FIG. 10(b) shows the cross sectional uniformity of Hf film.

Figure 11:
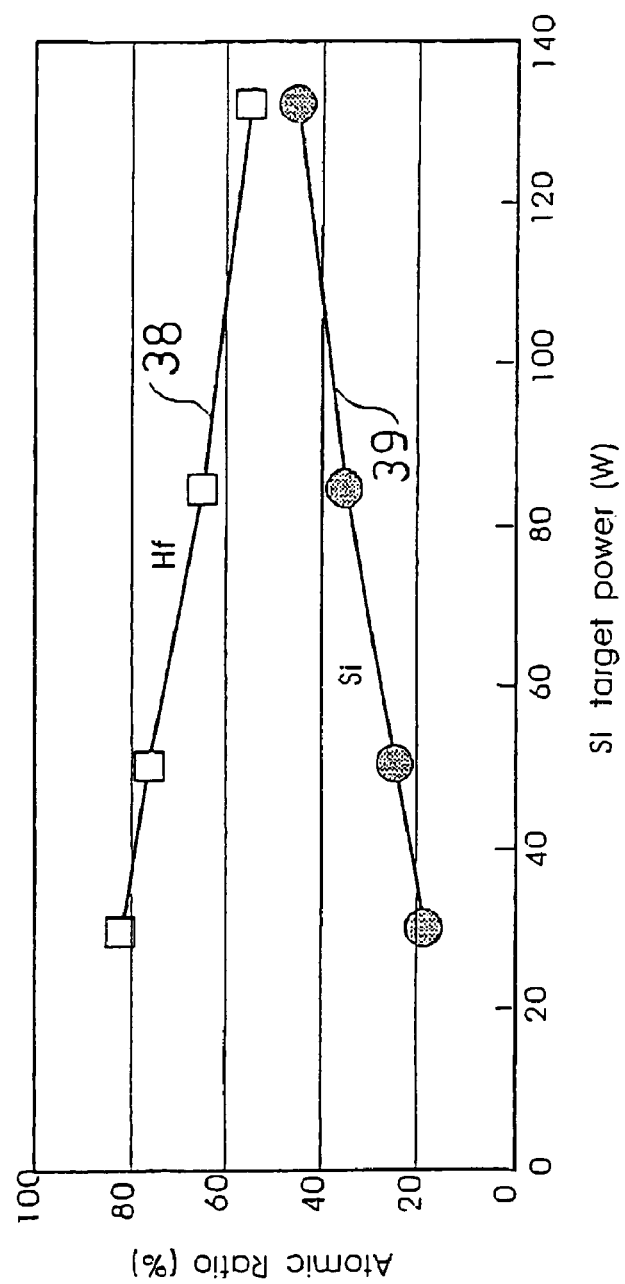

FIG. 11 shows a variation of HfSi film composition depending on applied DC power.

FIG. 12(a) shows uniform-counter lines of TaN film deposited on 200 mm wafer, FIG. 12(b) shows the cross sectional uniformity of TaN film.

Figure 13:
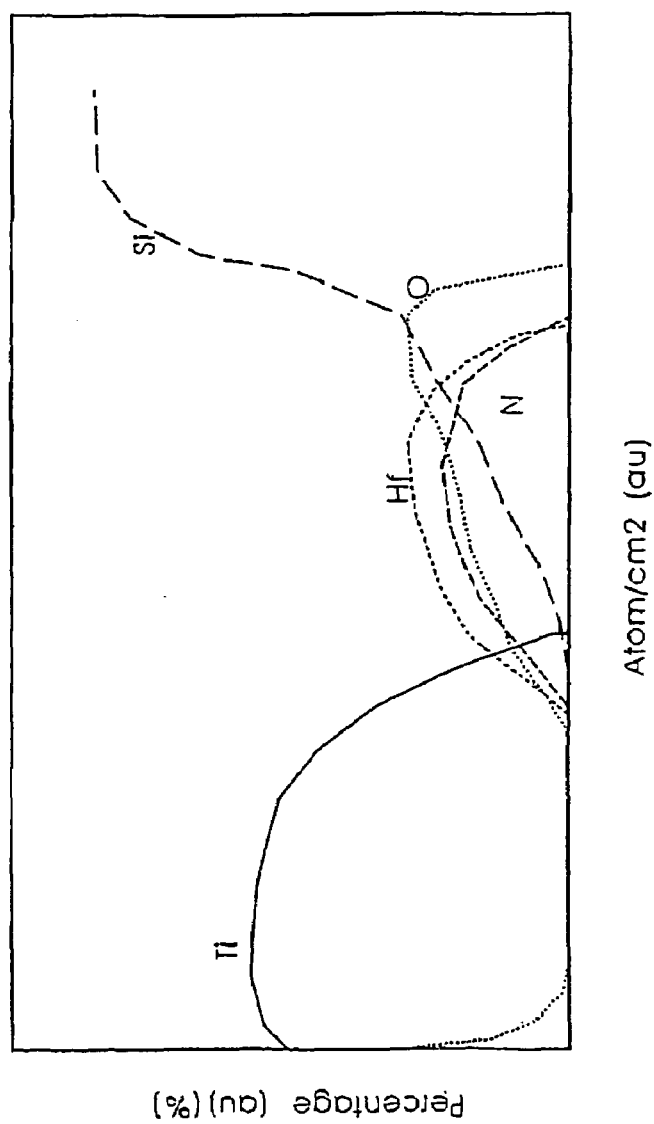

FIG. 13 shows RBS data obtained for HfSiON film.

Figure 14:
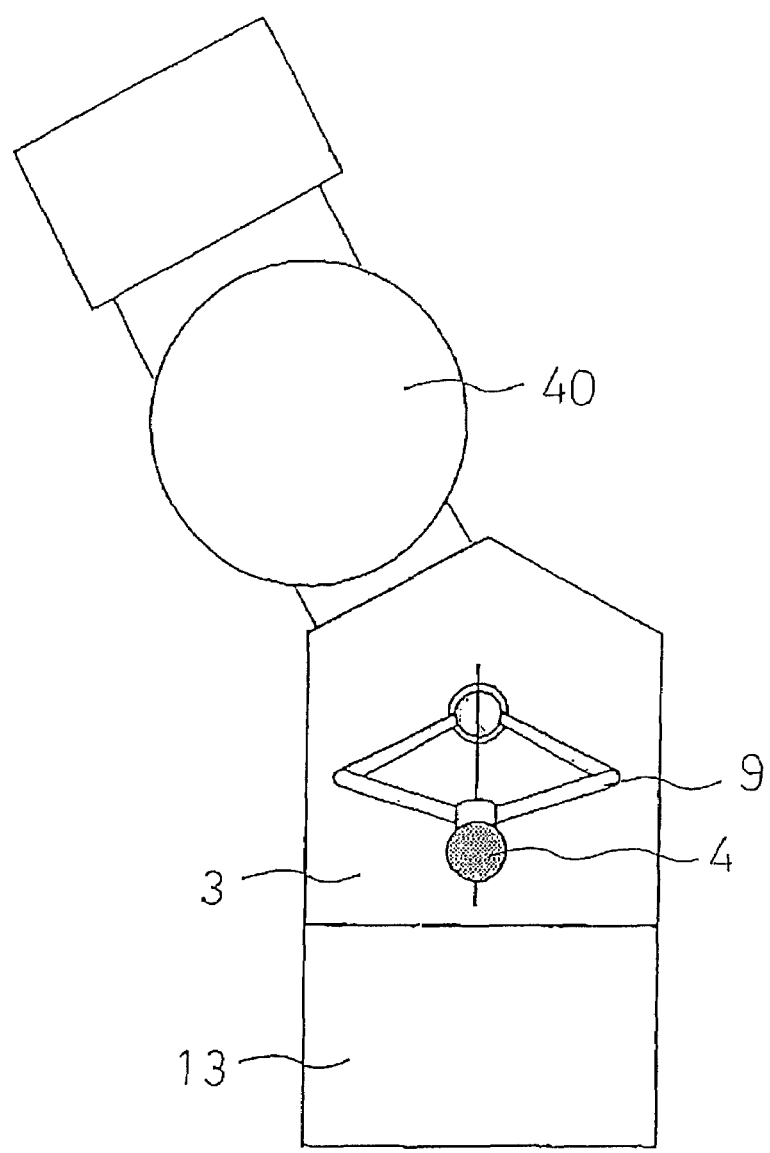

FIG. 14 shows a schematic diagram of wafer treating system in which CVD chamber for depositing high-k dielectrics using CVD technique is connected to central wafer-handling platform.

Figure 15:
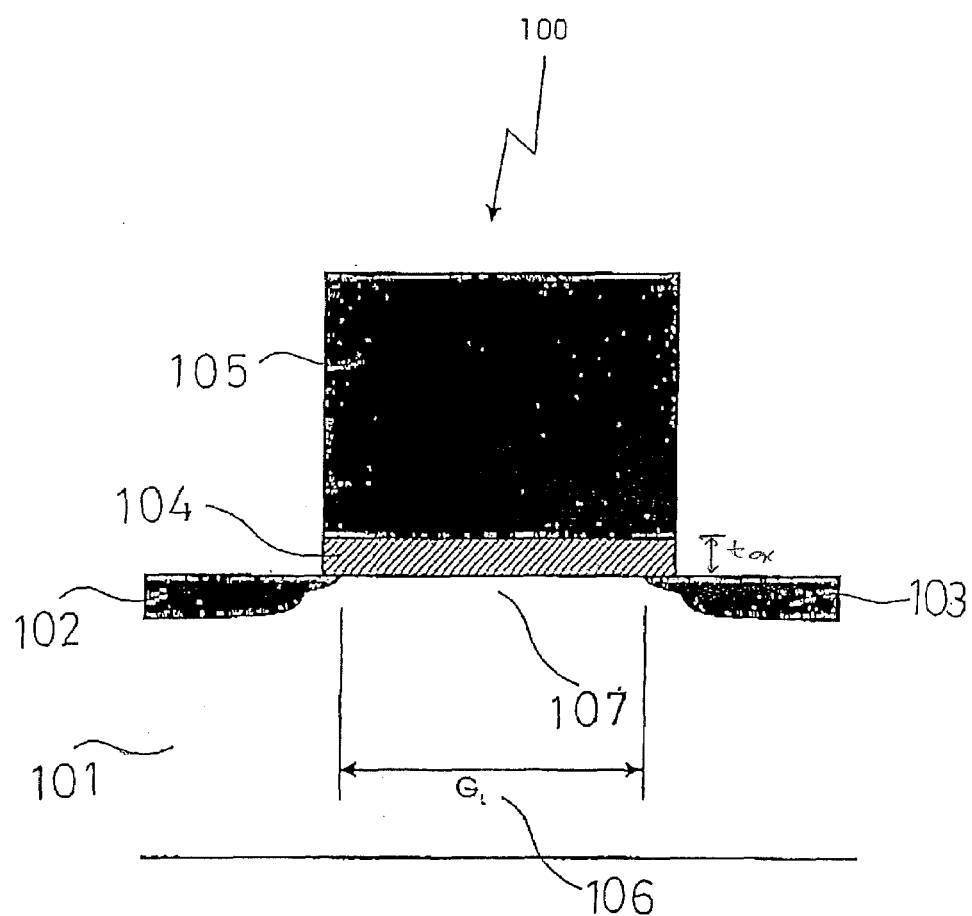

FIG. 15 shows a schematic view of MOSFET

Explanation of reference signs used to describe the preferred embodiments:
1. thermal annealing module
2. metal gate deposition module
3. central wafer-handling platform
4. substrate
5. wafer alligner
6. wafer load port
7. wafer unload port
8. cooling module
9. robot arm
10. high-k dielectric deposition module
11. angled-PVD module
12. angled-PVD module
13. wafer loading/unloading equipment-front-end module
14. target
15. target angle α
16. cathode
16a, 16b, 16c, 16d and 16e. cathodes
17. substrate holder
18. central axis of substrate holder
19. substrate holder
20. wafer heating mechanism
21. gas inlet
22. gas outlet
23. initially deposited very thin $SiO_2$ or SiON layer
24. starting material (film)
25. high-k dielectric
26. gate electrode
27. chamber wall
28. vacuuming port
29. wafer in/out port
30. backing plate
31. insulator
32. magnets
33. substrate in/out port.

DETAILED DESCRIPTION OF THE PREFERRED EMBODIMENTS

Preferred embodiments of the present invention are described in the following examples in detail using the attached drawings.

EXAMPLE 1

Figure 1:
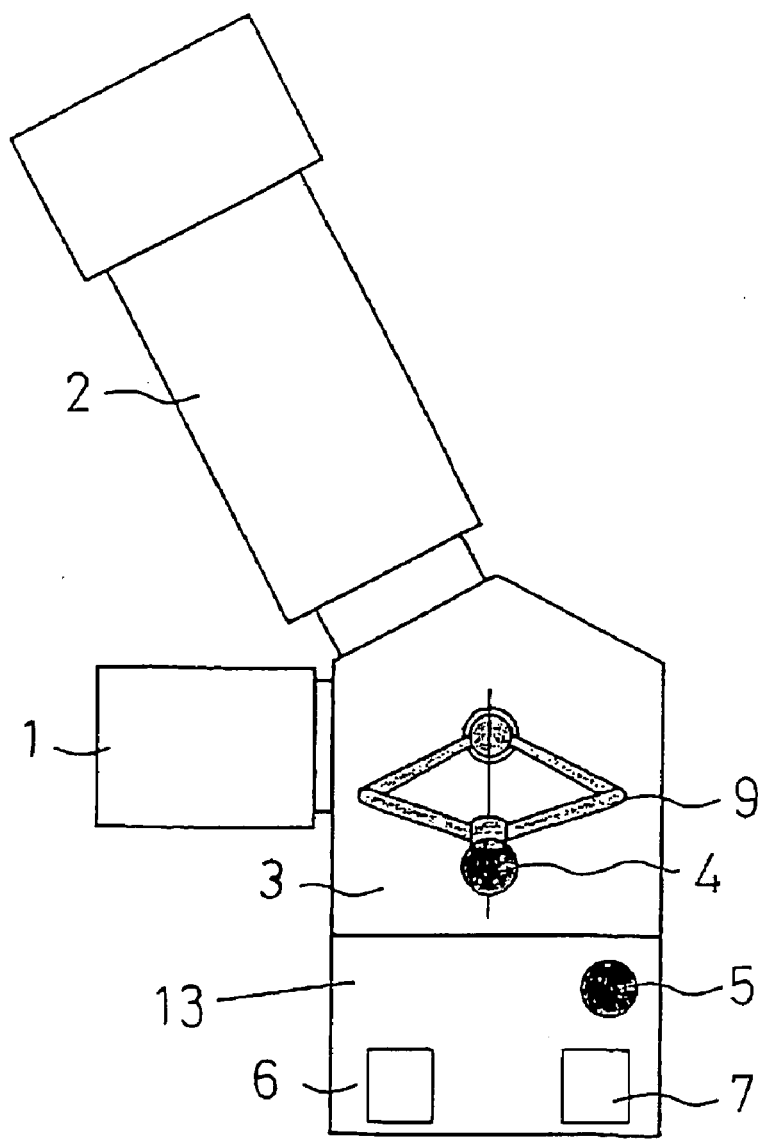
FIG. 1 shows a schematic diagram of integrated system used in working example one.

In FIG. 1, a thermal annealing module 1 and metal gate deposition module 2 are connected to a central wafer-handling platform 3, that is to say, a thermal annealing module 1 and metal gate deposition module 2 are integrated to a central wafer-handling platform 3.

Figure 6:
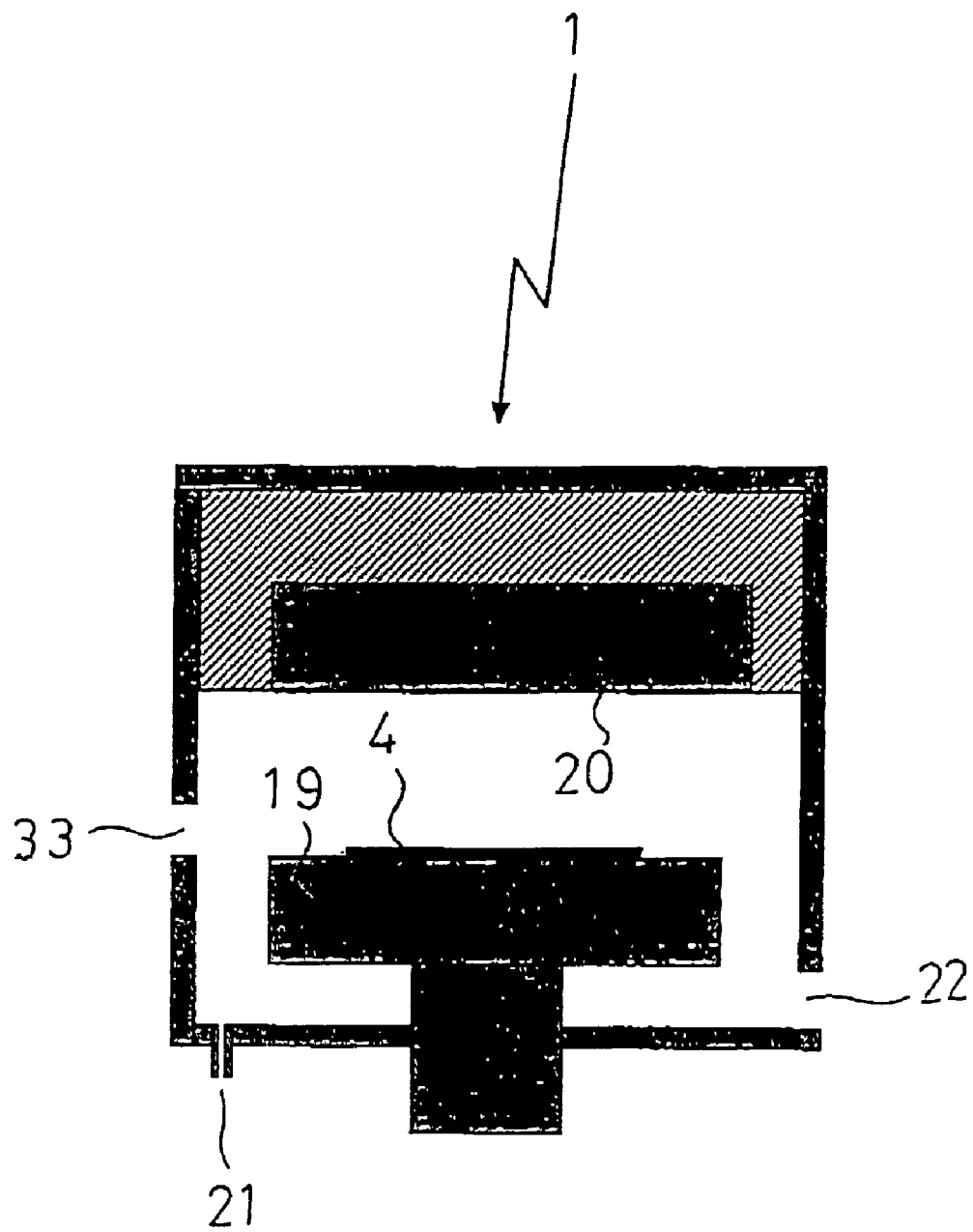
FIG. 6 shows a cross sectional view of thermal annealing module provided in the integrated system shown in FIG. 1.

A cross sectional view of the thermal annealing module 1 is shown in FIG. 6. Preferably, the thermal annealing module 1 is a rapid thermal annealing module. The thermal annealing module 1 such as an RTP (rapid thermal processing) module, shown in FIG. 6, is comprised of a substrate holder 19, a wafer heating mechanism 20 heating a substrate 4 placed on the substrate holder 19, gas inlet 21, a gas outlet 22 and substrate in/out port 33 as shown in FIG. 6.

Typically, the heating mechanism 20 is an infrared (IR) heating process assisted by IR lamps. Usually, the thermal annealing module 1 such as an RTP module can heat a substrate 4 to a temperature around 1000° C. within several seconds. During the substrate heating, substrate holder 19 may or may not be rotated. The thermal annealing module 1 such as an RTP module heats a substrate under a low-pressure with an inert gas or mixture of inert gas and a reactive gas.

The thermal annealing module 1 may employ any suitable technique to heat the substrate 4 to a higher temperature, for example IR lamps, furnace annealing, or RF heating. The annealing temperature may vary from 100° C. to 1200° C. The actual annealing temperature may change depending on the high-k materials. The annealing pressure is also not critical. The pressure may vary from $10^{-7}$ Pa to atmospheric pressure.

The metal gate deposition technique conducted in the metal gate deposition module 2 is also not important. The technique may be PVD, thermal CVD or plasma enhanced CVD, or atomic layer deposition. The deposition pressure, precursor gas or gas mixtures depend on the type of metal gate.

In addition to the thermal annealing and metal gate deposition modules 1, 2, a wafer loading/unloading equipment-front-end module 13 is attached to the central platform 3. Therefore, a thermal annealing module 1, metal gate deposition module 2 and a wafer loading/unloading equipment-front-end module 13 are integrated to a central wafer-handling platform 3. The wafer loading/unloading equipment-front-end module 13 comprises a wafer aligner 5, wafer load port 6 and unload port 7.

The substrate 4 with high-k dielectric film deposition thereon is placed in the thermal annealing module 1 in FIG. 1. Substrate 4 is then subjected to thermal annealing process in the thermal annealing module 1 at a desired temperature. The thermal annealing may be a single step or a two-step process with different gas atmospheres.

Then, substrate 4 is transferred into the metal gate deposition module 2 via the central wafer-handling platform 3 by the transfer means such as robot arm 9. And in the metal gate deposition module 2, metal gate material is deposited. The metal gate material may be any suitable material with appropriate electrical properties. For example metal gate material may be TaN, HfSi, RuTa, Ir, W, etc.

As described before, the annealing step for annealing a substrate with high-k dielectric film deposited thereon in a thermal annealing module and the depositing step for depositing a metal gate material on said annealed substrate in a metal gate deposition module are carried out consecutively without a vacuum break.

Figure 2:
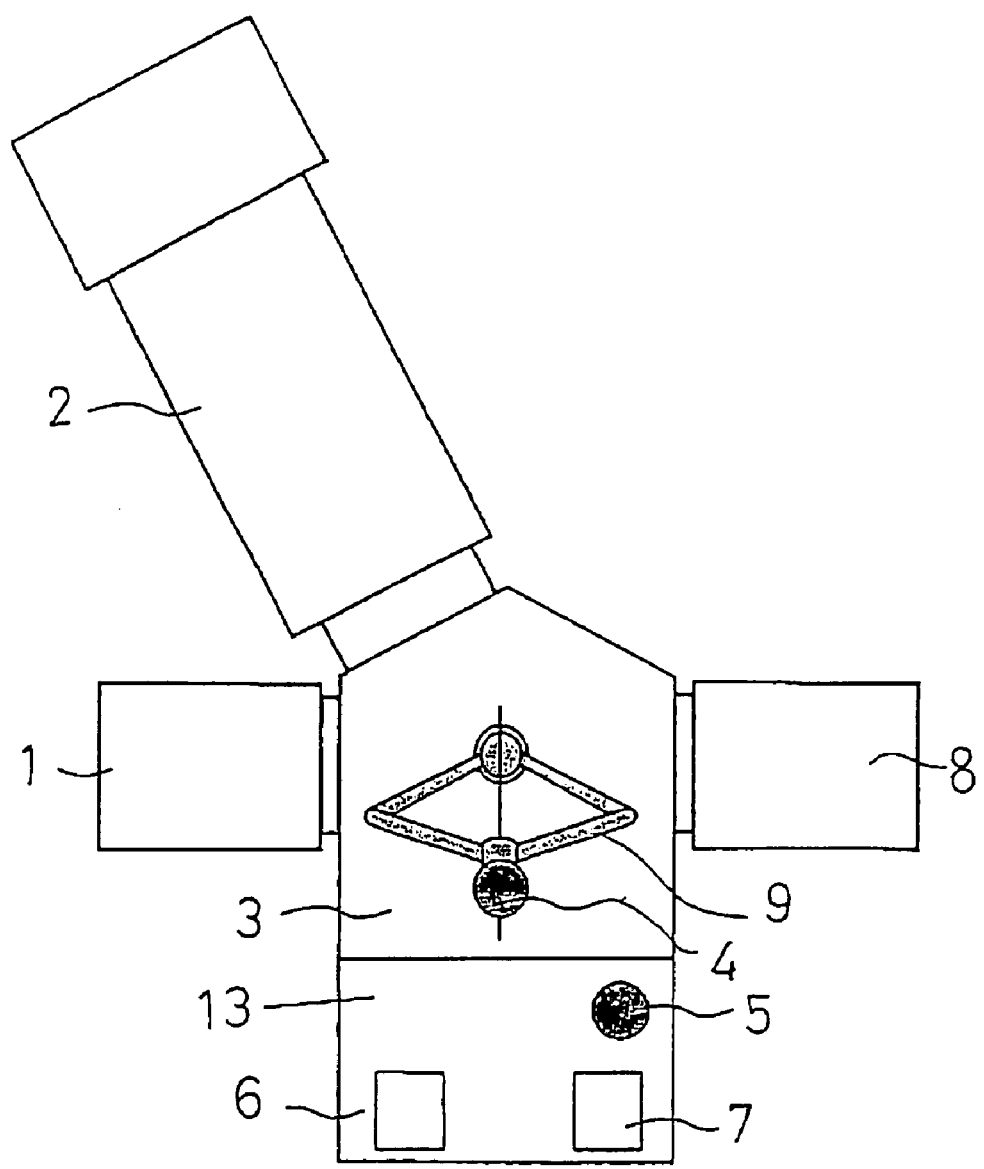
FIG. 2 shows another configuration for working example one.

FIG. 2 shows that a cooling module 8 is connected to the central wafer-handling platform 3 in addition to the configuration shown in FIG. 1. That is to say, in FIG. 2, a thermal annealing module 1, metal gate deposition module 2, a cooling module 8 and a wafer loading/unloading equipment-front-end module 13 are integrated to a central wafer-handling platform 3.

Using the integrated system shown in FIG. 2, after the thermal annealing of high-k dielectric mentioned above, one can cool down the substrate 4 before placing it inside the metal gate module 2.

That is to say, using the integrated system shown in FIG. 2, firstly conducting an annealing step annealing a substrate with high-k dielectric film deposited thereon in a thermal annealing module, then cooling said annealed substrate in a cooling module, and then depositing a metal gate material on said cooled substrate in a metal gate deposition module, wherein said annealing step, cooling step and depositing step can be carried out consecutively without a vacuum break.

As described before, the thermal annealing module and metal gate deposition module are integrated to a single central wafer-handling platform, so that immediately after the high-k annealing process, wafers can be transferred into metal gate deposition module without a vacuum break and deposit metal gate.

Also, the thermal annealing module, the cooling module, and metal gate deposition module are integrated to a single central wafer-handling platform, so that immediately after the high-k annealing process and cooling process, wafers can be transferred into the metal gate deposition module without a vacuum break and deposit metal gate.

Integration of thermal annealing system and metal gate deposition system to a one central wafer-handling platform, or integration of thermal annealing system, cooling system and metal gate deposition system to a one central wafer-handling platform can improve the high-k dielectric film and metal gate interface properties and thereby improve electrical characteristics and device performance.

EXAMPLE 2

Figure 3:
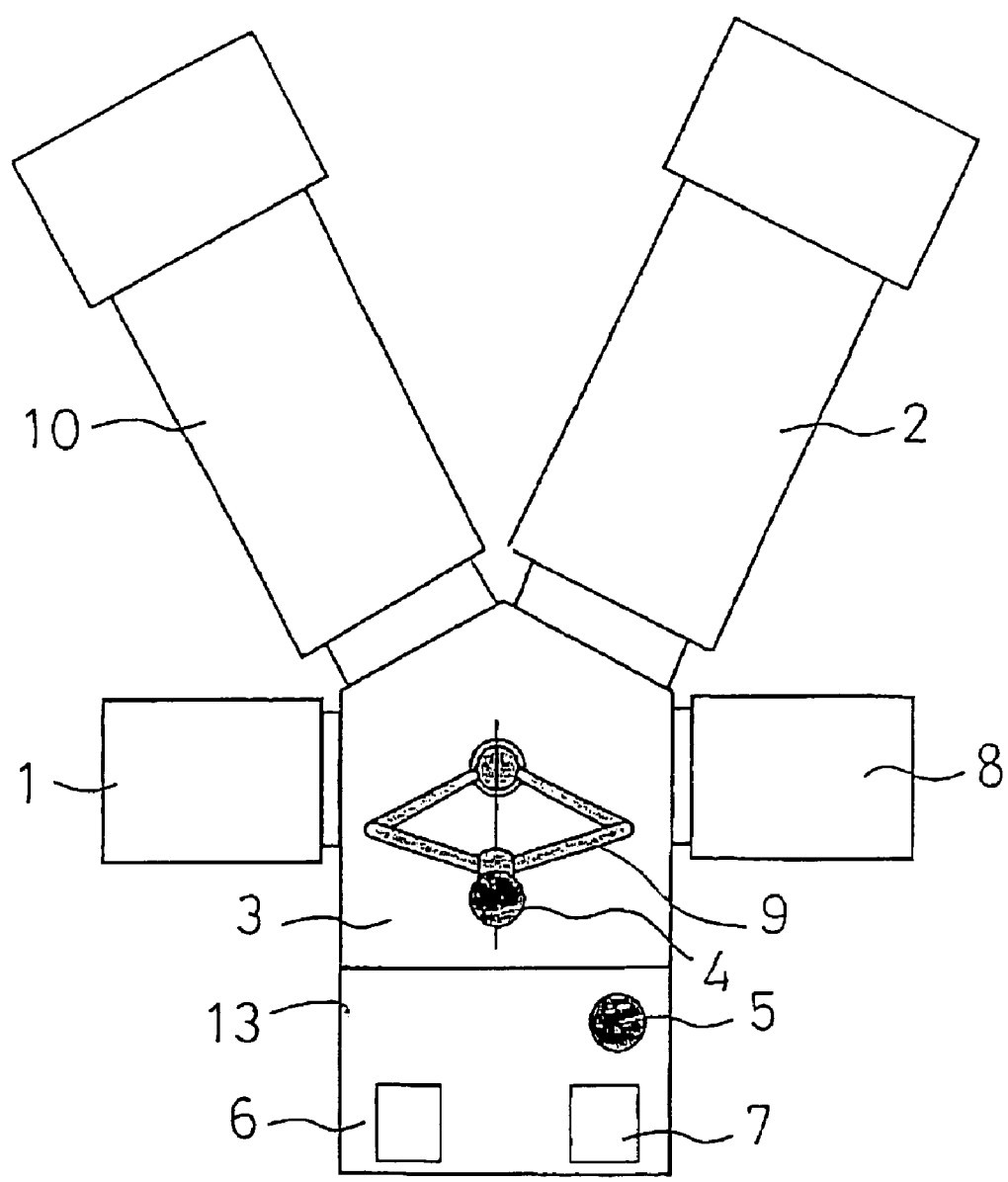
FIG. 3 shows a schematic diagram of working example two.

FIG. 3 shows an example which is an extension of working example 1, wherein there is an additional high-k dielectric deposition module 10 attached to the central wafer handling platform 3 described in working example 1.

In the example shown in FIG. 3, a high-k dielectric deposition module 10 is connected to the central wafer-handling platform 3 in addition to the configuration shown in FIG. 2. That is to say, in FIG. 3, a thermal annealing module 1, metal gate deposition module 2, a cooling module 8, a high-k dielectric deposition module 10 and a wafer loading/unloading equipment-front-end module 13 are integrated to a central wafer-handling platform 3.

A cooling module 8 may be removed from the configuration shown in FIG. 3.

The high-k dielectric deposition technique can be any desired technique, for example PVD, CVD, MOCVD or ALD. The parameters such as deposition pressure, precursor gases, temperature etc., depend on the type of deposition technique and high-k material.

First, high-k dielectric, for example $HfO_2$, is deposited on a substrate 4 by placing a wafer in high-k dielectric deposition module 10. One can also deposit a metal or metal alloy in the high-k deposition module 10, for example Hf, HfSi, HfAl etc., to be oxidized in the thermal annealing module 1. The substrate 4 is then transferred into the thermal annealing module 1 and performs the annealing process. The annealing is usually a single step in oxygen or in an inert gas environment. One can however, carry on a two-step annealing process where in the first step annealing is done in an oxygen atmosphere at relatively a lower temperature, while in the second step annealing is done in an inert gas environment at relatively a higher temperature.

Then by using the cooling module 8, the wafer is cooled down. Thereafter, the wafer is transferred into metal gate deposition module 2, and deposits a metal.

When the configuration given in FIG. 3 is used, high-k deposition, thermal annealing and metal gate deposition can be done without a vacuum break. This results in further improvement of film quality and thereby semiconductor device quality.

Using the integrated system shown in FIG. 3, the following process can be conducted. Firstly, depositing a high-k dielectric film on a substrate in a high-k deposition module, annealing said substrate on which high-k dielectric film is deposited in a thermal annealing module, cooling said annealed substrate in a cooling module, and then depositing a metal gate material on said cooled substrate in a metal gate deposition module wherein said first depositing step, annealing step, cooling step and second depositing step are carried out consecutively without a vacuum break.

Also, the following process can be conducted. After the first depositing step depositing a thin thermal SiO$_2$ film on a substrate in a thermal annealing module, cooling said substrate in a cooling module, depositing a high-k dielectric film on said substrate in a high-k deposition module, annealing said substrate in a thermal annealing module, cooling said annealed substrate in a cooling module, and then depositing a metal gate material on said cooled substrate in a metal gate deposition module wherein said first depositing step, first cooling step, second depositing step, annealing step, second cooling step and third depositing step are carried out consecutively without a vacuum break.

As described before, the thermal annealing module, the cooling module, the high-k deposition module, and the metal gate deposition module are integrated to a single central wafer-handling platform, so that immediately after the high-k annealing process and cooling process, wafers can be transferred into metal gate deposition module without a vacuum break and deposit metal gate.

Integration of the thermal annealing system, the cooling module, the high-k deposition module, and the metal gate deposition module to a one central wafer-handling platform can improve the high-k dielectric film and the metal gate interface properties and thereby improves electrical characteristics and device performance.

EXAMPLE 3

Figure 4:
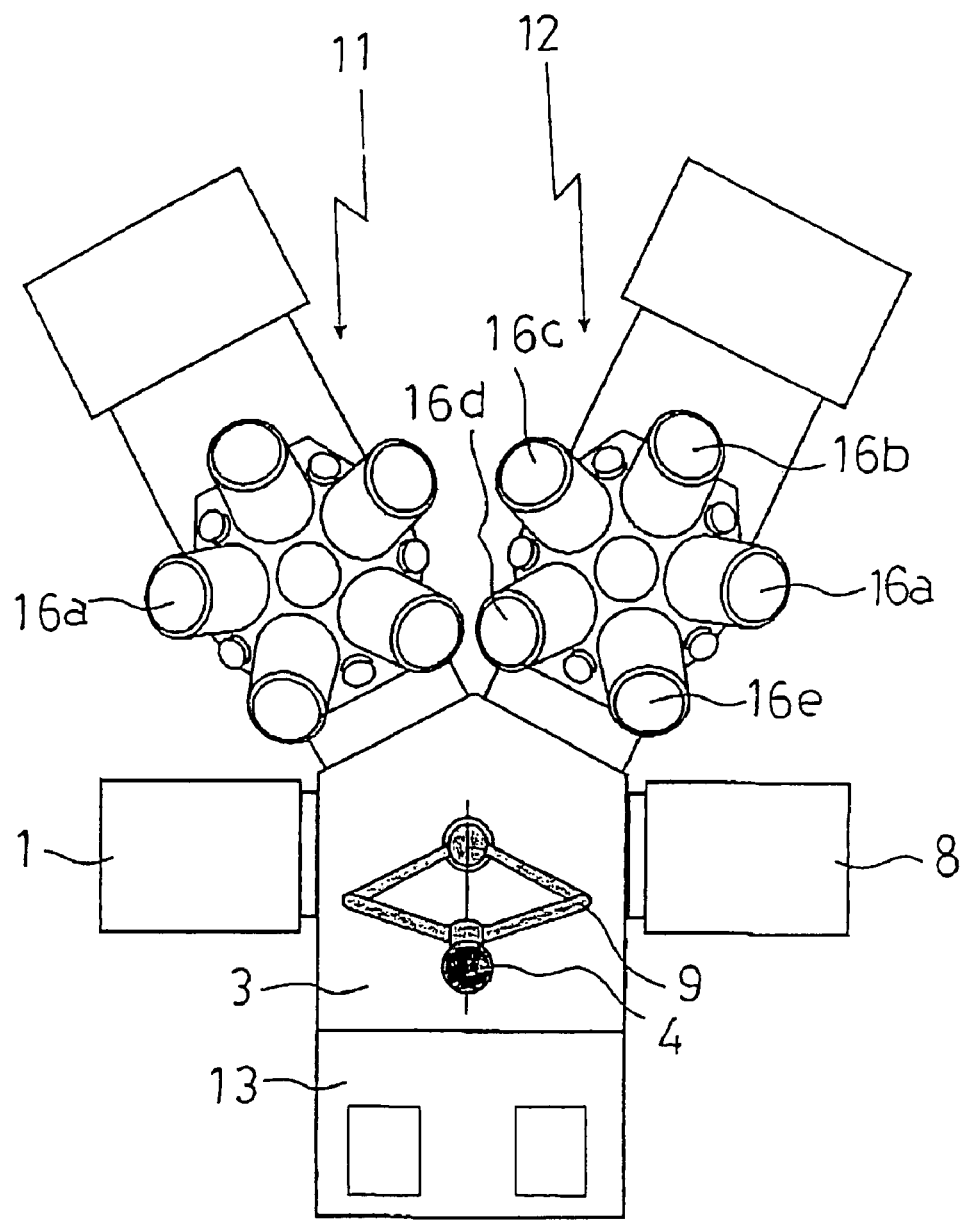
FIG. 4 shows a schematic diagram of another integrated system.

FIG. 4 shows a schematic diagram of the integrated system comprised of two angled-PVD modules 11 and 12, one thermal annealing module 1, a cooling module 8, a central wafer-handling platform 3, and a wafer loading/unloading equipment-front-end module 13.

The hardware configuration of both angled-PVD systems 11 and 12 are the same except the target materials fixed to each cathode. A cross sectional diagram of an example of an angled-PVD module which can be adopted in the substrate treating system of the present invention is shown in FIG. 5.

The angled-PVD modules 11 and 12 is comprised of a chamber having a chamber wall 27, a vacuuming port 28 and a wafer in/out port 29. The substrate holder 17 is provided in the chamber as shown in FIG. 5.

The angled-PVD modules 11 and 12 employ off-axis sputtering technology where substrate 4 and target 14 surfaces are not parallel as in conventional PVD systems. Instead these two surfaces make an angle α (denoted by numeral 15) as shown in FIG. 5. This angle α (15) is however, not critical and can lie in the range of 10° to 90°, but typically lies around 45°. Each angled-PVD system may have one or more angled targets. For example, as one cathode 16 is shown in FIG. 5, each PVD system shown in FIG. 4 accommodates 5 cathodes (16$a$, 16$b$, 16$c$, 16$d$ and 16$e$) and thereby 5 targets 14.

Figure 5:
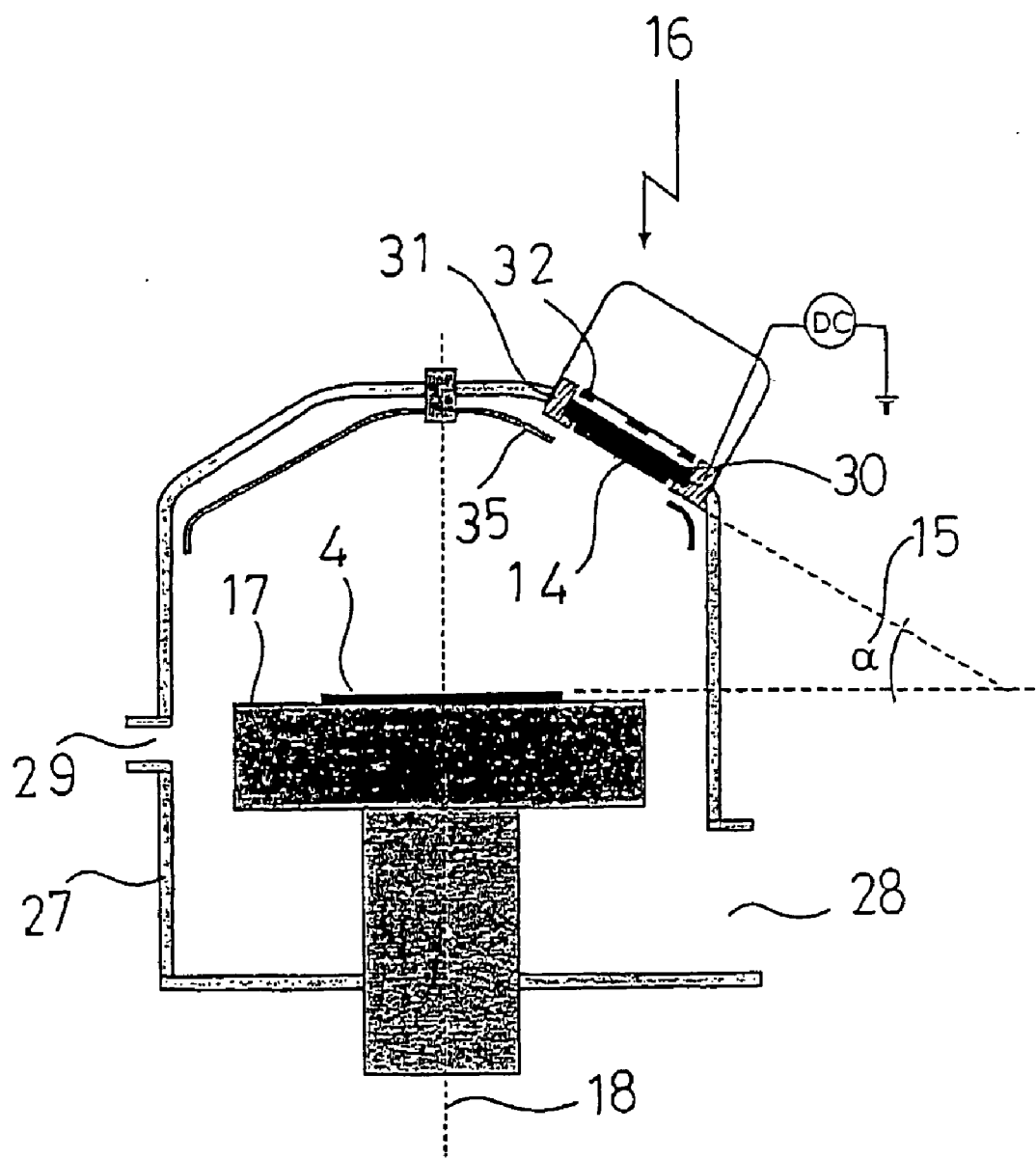
FIG. 5 shows a cross sectional view of angled-PVD module provided in the integrated system shown in FIG. 4.

In each cathode, as shown in FIG. 5, backing plate 30 is provided on the opening of cathode 16 by insulator 31. Target 14 is supported by the front side of the backing plate 30, and magnets 32 are provided at the back side of backing plate 30. The magnets 32 are rotated during film deposition.

A target 14 made of a metal, metal nitride or metal oxide or a semiconductor is fixed to each cathode 16$a$ to 16$e$. Each cathode is supplied with a DC, as shown in FIG. 5, or RF electrical power to ignite and maintain a plasma. The ions in the plasma sputter the target material and these sputtered atoms are deposited on the substrate 4 placed on substrate holder 17.

The substrate holder 17 where a substrate 4 is placed for the film deposition rotates around its central axis 18 during film deposition. The rotation of substrate holder 17 is of importance to obtain a uniform film thickness over the wafer surface since sputtered atoms are coming with an angle.

The PVD module can accommodate 5 cathodes (16$a$, 16$b$, 16$c$, 16$d$, 16$e$) at the same time. These cathodes 16$a$ to 16$e$ are fixed to the ceiling of the angled PVD modules 11 and 12 respectively with an angle α(15) with respect to the surface of substrate 4. This angle α(15) is not critical and can be varied in the range of 0 to 90°, but typically lies around 45°. In each cathode 16, there is a metal or dielectric target 14 as an integrated part of the cathode 16. Above the target 14, there is a magnet 32, which is rotated during film deposition. The magnet 32 however, is not essential. Use of magnet 32 increases the plasma density and confines the plasma to the region below the target suppressing diffusion towards the wall 27 of the chamber of PVD module. The diameter of a target 14 is also not critical and is usually around 200 mm. The target 14 is simply a planar plate firmly fixed to a backing plate 30. The backing plate 30 is usually cooled using circulating water or any other suitable liquid. The cooling mechanism of the backing plate 30 is not shown for the clarity of the diagram.

In FIG. 5 numeral 35 indicates a shutter.

Each cathode 16 is electrically isolated from the rest of the hardware and connected to a DC or RF electrical supply unit. In FIG. 5 only a DC power source is shown. The DC or RF power applied to a target 14 is not critical but typically lies lower than 500 W. The reason is high-k materials that should be deposited on a substrate 4 should be very thin. Therefore, in order to control the film thickness to a greater accuracy, film deposition rate must be lowered. So that, by measuring the depositing time, film thickness can be controlled accurately.

The angled PVD modules 11 and 12 are vacuumed to a lower pressure and maintained at a low-pressure before and after plasma is ignited. The inside pressure in the chamber of angled PVD modules 11 and 12 is not critical, however, deposition is usually carried out at a pressure lower than 1 Pa.

It is possible to obtain extremely uniform depositing film, by considering and comparing the mean-free-path of gas atoms in the PVD modules 11 and 12 with respect to the substrate-to-target distance.

The sputter deposition can be carried out with the use of an inert gas plasma, such as Ar plasma or using a gas mixture such as Ar+O$_2$ or Ar+N$_2$. When a reactive gas mixture is used, sputtered atoms react with the gaseous species and form a different product such as metal nitride or oxide and then are deposited on the water surface. The film deposition is usually carried out at a pressure lower than 1 Pa, however, as this is not critical, one can use a different pressure for the film deposition.

The film deposition can be done using a single target 14 by supplying DC or RF power to that appropriate target. Or, film deposition can be done by a co-sputtering process where RF or DC power is supplied to two or several targets 14, which are provided at each cathode 16$a$ to 16$e$, at the same time. In this case, the atomic composition of alloy material is controlled by adjusting the DC or RF electrical power applied to each target.

One of the angled-PVD systems may be used for high-k dielectrics while the other may be used for gate electrode deposition.

The thermal annealing module 1 used in the configuration of FIG. 4 is the same as shown in FIG. 6 and described in Example 1.

When a substrate 4 with a film deposited in angled PVD module 11 is placed in the thermal annealing module 1 such as RTP module, it is heated to a higher temperature usually over 400° C. under a reactive gas mixture, preferably with $Ar+O_2$ gas mixture. During this heating, the metal, metal-alloy or metal nitride films get oxidized and become a dielectric.

The heating by the thermal annealing module 1, such as RTP module, can be carried out in two or more steps under the same or different gas environments. In the first step, for example, heating is carried out only to oxidize the film deposited on a wafer surface, and in the second or later steps the wafer is heated to even a higher temperature to mix the oxidized film with underlying Si or any other underlying film.

The cooling module 8 is comprised of at least a wafer stage cooled to a lower temperature.

Again, there may be an electrostatic chuck mechanism integrated to the wafer stage to clamp the wafer on to the wafer stage. This is important if the wafer cooling must be done at a higher rate. The pressure inside the cooling module 8 is not important and can be in the range of atmospheric pressure to lower pressures as low as $10^{-7}$ Pa.

The central wafer-handling platform 3 includes a transfer means such as a robot arm 9 that delivers substrate 4 between angled PVD module 11 and central wafer-handling platform 3, thermal annealing module 1 and central wafer-handling platform 3, angled PVD module 12 and central wafer-handling platform 3, cooling module 8 and central wafer-handling platform 3, and wafer loading/unloading equipment-front-end module 13 and central wafer-handling platform 3, respectively, without a vacuum break.

The wafer loading/unloading equipment-front-end module 13 is also comprised of at least a wafer handling robot arm and one or several stages to place wafer cassettes. These are not shown in figures for simplicity.

Figure 7:
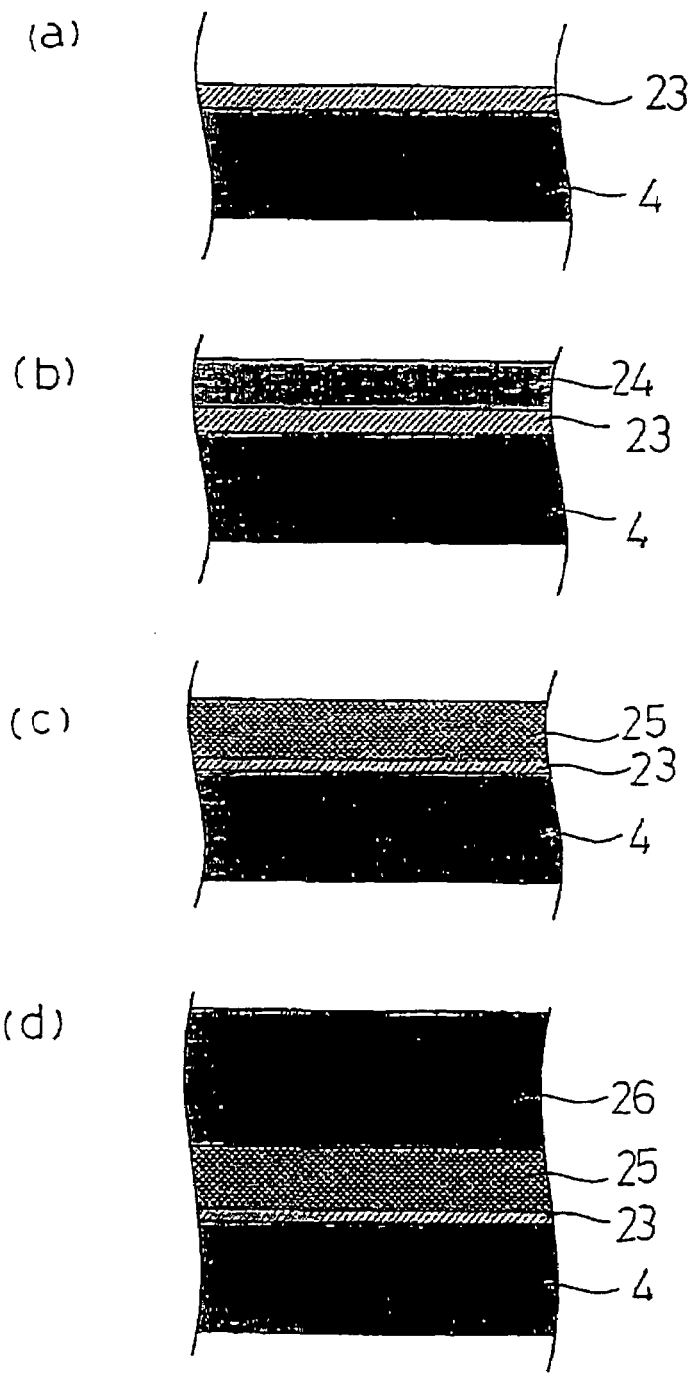

A method of high-k and metal gate preparation is as follows and explained with reference to FIG. 7.

Step-1 Deposit preliminary film for high-k dielectric
Step-2 Thermally anneal under oxygen atmosphere to form high-k dielectric
Step-3 Cool down the wafer
Step-4 Deposit metal electrode material.
Detailed Description of the Deposition Method:
Step-1

The starting wafer may or may not have an initially deposited very thin $SiO_2$ or SiON layer 23. This is shown in FIG. 7(a).

A starting material 24 for high-k dielectric is deposited on substrate 4 using one of the angled-PVD modules (FIG. 7(b)). The starting material 24 may be a metal, preferably a refractory metal such as Hf, Ta, Zr etc., a metal nitride such as HfN, TaN, TiN etc., a metal alloy such as HfTa, HfTi, etc., a metal-semiconductor alloy such as HfSi etc. or metal alloy nitrides such as TaSiN etc.

Again, one can deposit two or several films mentioned above as a stacked configuration, for example, Hf/SiN/Hf, HfN/AlN, or Hf.

Usually, Hf, Zr, Ti, or Ta is used as a metal target 14. However, other metal targets can be used. In case a metal-semiconductor alloy is deposited, preferably the semi-conducting material is Si.

Though it is not critical, the film thickness of the above starting materials is usually kept less than 5 nm, typically around 2 nm.

Step-2

After the deposition of starting film 24 as described above, substrate 4 is transferred to thermal annealing module 1. The substrate 4 is heated to a higher temperature usually over 400° C., under an oxygen gas atmosphere, so that starting material gets oxidized (FIG. 7(c)) forming a high-k dielectric 25. The heating process can be carried out as a single step or several steps. Usually, a heating procedure with two steps or several steps is more suitable to control the chemical reaction during annealing process. For example, first the film is heated to 400° C. to oxidize the metallic elements in the starting material. If the film is heated to a very high temperature at once, for example to 800° C., metallic elements in the film may form their silicides, which are stable and show metallic features. Once the film is properly oxidized at a relatively lower temperature such as 400° C., the temperature is raised to a higher value, for example to 900° C., preferably in an inert gas environment. If metal stacks of different metals are used as the starting material, high-temperature annealing is important for inter-diffusion of each material and to form a uniform film composition.

Step-3

After completion of thermal annealing process, substrate 4 is transferred to the cooling module 8 and cooled to a desired temperature, preferably to the room temperature.

Step-4

The substrate 4 is transferred to the other angled-PVD module and a gate electrode 26 is deposited on it. (FIG. 7(d)).

The gate material may be a metal such as Ta, Ru, Hf, etc., a metal nitride such as TiN, HfN, TaN, etc., a metal alloy such as RuTa, HfTa, etc., a metal semiconductor alloy such as HfSi, TaSi, etc., metal semiconductor alloy nitrides such as TaSiN, etc. or a stack of above mentioned films such as Hf/TaN/TiN, Ru/Ta/TaN, etc.

In depositing film stacks one on each other, the substrate does not have to be removed from the angled-PVD module to deposit each film. Since this PVD module has five cathodes 16a to 16e and supports up to 5 different targets, by fixing appropriate targets one can deposit any desired metal stacks in the same angled-PVD module.

After the gate electrode deposition, the substrate may be subjected to a thermal annealing process, particularly if metal stacks are deposited. During this thermal annealing process, metal stacks inter-diffuse and form a new uniform composition. Otherwise, one can take the wafer directly out from the integrated system shown in FIG. 4 after the gate electrode deposition.

Preferably, before placing a wafer in the above integrated system, the substrates are treated as follows to get improved electrical properties.

1. The substrate is cleaned with diluted HF solution to remove native oxide on the surface.
2. Dry the substrate.
3. Deposit a very thin layer of thermal $SiO_2$ (eg. 1 nm) (eg. Initially deposited film 23 shown in FIG. 7(a)). This process can be conducted in the thermal annealing module 1.

The reason for the use of a thin $SiO_2$ layer 23 on the Si substrate 4 is that after the preparation of overall film deposition process as described-above, a fraction of the originally deposited $SiO_2$ layer 23 remains at the interface between the Si substrate 4 and the high-k dielectric 25 as shown in FIGS. 7(c) and 7(d). This results in a lower leakage current, lower voltage hysterias, and improved electron mobility in the channel region in a MOSFET.

The angled PVD modules 11, 12 shown in FIG. 5 and used in the configuration of FIG. 4 can achieve a higher deposition rate. As a result of the higher deposition rate, an economically viable throughput can be obtained by the present invention.

EXAMPLE 4

In FIG. 8, there are two angled PVD modules 11 and 12, two thermal annealing modules 1a and 1b, one cooling module 8 and wafer loading/unloading equipment front-end module 13 attached to a central wafer-handling platform 3.

Compared to the integrated system explained in working example 3, there is an additional thermal annealing module in this working example 4. Except for this addition, all the other hardware are the same as that explained in working example 3. This additional thermal annealing module is used for high-temperature annealing of gate electrode material. Use of separate thermal annealing modules to anneal starting material to form high-k dielectric and gate electrode, increases the throughput and minimize cross contamination. Except for the above-mentioned difference, all the other processing steps and procedures are the same as that explained in working example 3.

EXAMPLE 5

FIG. 9 shows a schematic diagram of the integrated system for the deposition of high-k dielectric, which is comprised of an angled PVD module 11, a thermal annealing module 1 such as RTP module, a central wafer-handling platform 3 and a wafer loading/unloading equipment-front-end module (EFEM) 13.

The construction and mechanism of the angled PVD module 11 is described in Example 3 and shown in FIG. 5. So that, they are omitted from this example.

FIG. 10(a) shows a Hf film uniformity deposited on a 300 mm wafer at a pressure of 0.015 Pa using the angled PVD module 11. The other parameters used for that deposition are as follows. Target-to-substrate vertical distance=250 mm, DC power applied to Hf target=300 W, substrate holder rotation speed=240 rpm, Plasma gas=Ar. The standard deviation ($\sigma$) of larger number of film thickness measurements is usually given as the film non-uniformity. The standard deviation ($\sigma$) of 49-points measurement on Hf film given in FIG. 10(a) is 0.16%. The lines shown in FIG. 10(a) are the constant-uniform contours 36. The numeral 37 given at each contour is the normalized uniformity. FIG. 10(b) shows the normalized uniformity across a diameter line.

In case of bi-metal or metal alloy depositions, two or many targets (16a, 16b,) are given DC or RF power simultaneously. By adjusting the DC or RF power applied to each cathode, the composition of metal alloy can be varied. For example FIG. 11 shows the controllability of HfSi composition. The deposition condition for FIG. 11 is as follows.

Process gas=Ar, Pressure=0.015 Pa, Hf target DC power=70 W, Si target DC power=30 W to 130 W, Substrate-to-target distance=250 mm. The Hf fraction of HfSi film can be controlled from 55% to 82% (or Si fraction from 45% to 18%) by controlling the DC power applied to Si target. In FIG. 11, variation of Hf fraction in HfSi film is denoted numeral 38 and variation of Si fraction in HfSi film is denoted numeral 39.

In case of reactive sputter depositions, a reactive gas, for example oxygen or nitrogen is added to the PVD module in addition to an inert gas, for example Ar. The reactive gas decomposes in the plasma and reacts with the sputtered atom and then deposits on the wafer surface. For example, FIG. 12(a) shows film the uniformity of a TaN film deposited by a reactive sputtering method using Ar+$N_2$ gas mixture with the following condition.

Ta target DC power=300 W, Plasma gas=Ar, Pressure=0.015 Pa, Ar flow rate=30 sccm, $N_2$ flow rate=10 sccm, substrate-to-target distance=250 mm.

Figure 12:
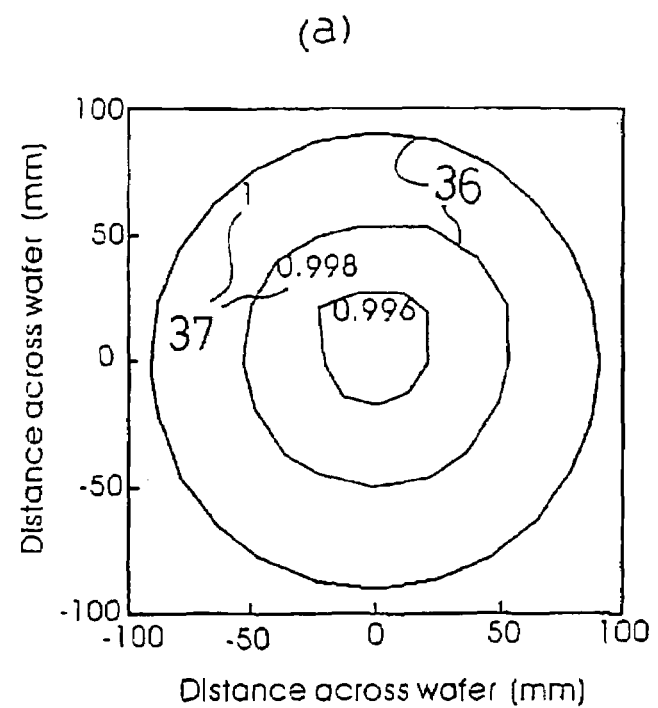
Figure 12:
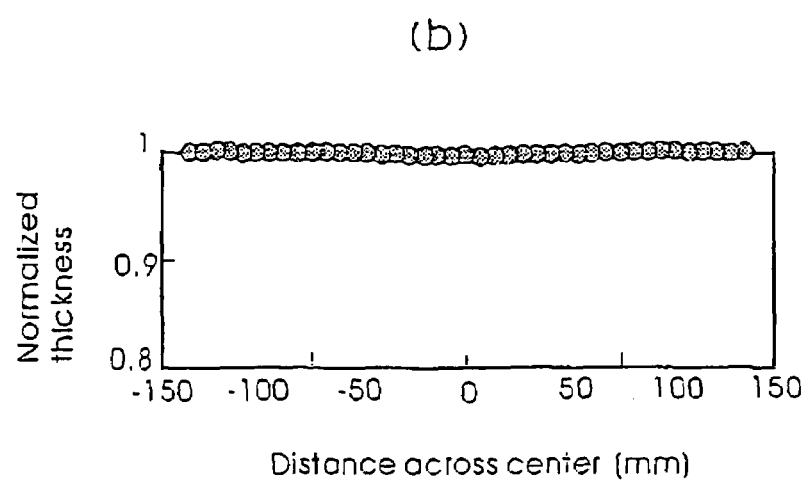

FIG. 12(a) shows the constant uniform contours 36 while FIG. 12(b) shows the normalized uniformity across a diameter line. The standard deviation of 49-thickness measurement on TaN film shown in FIG. 12 is 0.13%.

After a film is deposited in PVD module 11, substrate 4 is transferred to the thermal annealing module 1 without a vacuum break.

The thermal annealing module 1 is an RTP module shown in FIG. 6 and described in the before described example 1.

The heating by the thermal annealing module 1 such as RTP module can be carried out in two or more steps under the same or different gas environments. In the first step, for example, heating is carried out only to oxidize the film deposited on a wafer surface, and in the second or later steps wafer is heated to an even higher temperature to mix the oxidized film with underlying Si or any other underlying film.

For example, HfSiON film is fabricated with the following procedure.

Started with p-type Si wafer

Cleaned with HF to remove native oxide

Deposited 1 nm thermal $SiO_2$

Deposited 1 nm HfN by placing in the PVD module (11)

Placed wafer in RTP module (1)

Annealed at 400° C. for 30 sec. in an oxygen ambient

Annealed at 800° C. for 30 sec. in an inert gas ambient

Wafer is taken out and film is evaluated.

During the first annealing step the HfN film is oxidized and forms HfON. During the second annealing step, the HfON and underlying $SiO_2$ films get intermixed and form HfSiON. RBS spectra obtained for the above film is shown in FIG. 13, which clearly shows the film is HfSiON.

It should be noted that after the RTP process, a Ti film is deposited as a capping layer to prevent further oxidation of the prepared high-k film.

During the second RTP process only a fraction of the initially deposited thermal $SiO_2$ film is consumed to form HfSiON. Therefore, a thin $SiO_2$ layer remains below the HfSiON film just above the semiconductor.

It is preferable to have a very thin layer of thermal $SiO_2$ remaining below the HfSiON film to improve the electron mobility in the channel region 107 (FIG. 15). Accordingly, one should control the RTP temperature and time to consume only a fraction of thermal $SiO_2$. By this method, one can therefore, have very thin thermal $SiO_2$ layer, for example 5 angstroms, under the HfSiON layer. The importance of this process is that there is no reliable technique for directly depositing such a thin $SiO_2$ layer.

HfSiON is considered as a high-k material with a relative dielectric constant between 15-24 depending on film composition.

Similar to the method explained above, one can deposit many other different high-k materials using PVD module and RTP module without having a vacuum-break.

Since this process does not involve a vacuum-break, the overall process is very reliable and repeatable, so that this process can be confidently applied in actual device fabrications.

As described before, a PVD (physical vapor deposition) module and RTP (rapid thermal processing) module are integrated together with the use of wafer transfer module and EFEM (equipment front-end module), wherein first a metal, metal nitride or metal oxide film is deposited on a substrate by placing in PVD module and secondly the wafer is subjected to RTP process to convert metal film into dielectric and/or improve dielectric properties. The film deposition step and RTP process is carried out without a vacuum break so that film deposited by this procedure gives repeatable and reliable properties.

The present invention is not limited to the preferable examples described above, and may be modified to various embodiments within the technological scope defined by the accompanying claims and equivalents thereof.

What is claimed is:

1. A method of fabricating a metal gate of a transistor in a substrate processing system which comprises a wafer transfer module provided with a transfer unit for transferring a wafer, a thermal annealing module, a cooling module, a first PVD module, and a second PVD module, all of which are respectively connected to the wafer transfer module, the method comprising:
   a first step of transferring a wafer substrate through the wafer transfer module into the thermal annealing module by using the transfer unit;
   a second step of forming an $SiO_2$ film on the wafer substrate in the thermal annealing module;
   a third step of transferring the wafer substrate, on which the $SiO_2$ is formed, through the wafer transfer module into the cooling module by using the transfer unit;
   a fourth step of cooling the wafer substrate, on which the $SiO_2$ is formed, in the cooling module;
   a fifth step of transferring the wafer substrate subjected to the cooling by the fourth step, through the wafer transfer module into the first PVD module by using the transfer unit;
   a sixth step of forming a metal film on the $SiO_2$ film in the first PVD module;
   a seventh step of transferring the wafer substrate, on which the metal film is formed, through the wafer transfer module into the thermal annealing module by using the transfer unit;
   an eighth step of thermally annealing the wafer substrate, on which the metal film is formed, in the thermal annealing module to transform the metal film into a high dielectric film;
   a ninth step of transferring the wafer substrate, on which the high dielectric film is formed, through the wafer transfer module into the cooling module by the transfer unit by using the transfer unit;
   a tenth step of cooling the wafer substrate, on which the high dielectric film is formed, in the cooling module;
   an eleventh step of transferring the wafer substrate subjected to the cooling by the tenth step, through the wafer transfer module into the second PVD module by using the transfer unit; and
   a twelfth step of forming a metal electrode on the high dielectric film;
   wherein the first step to the twelfth step are sequentially conducted without exposing the formed $SiO_2$ film, formed metal film and formed high dielectric film to an ambient atmosphere by transferring the wafer substrate in a vacuum environment from one module to another module through the wafer transfer module.

2. The method according to claim 1, wherein the metal film formed at the sixth step comprises a refractory metal.

3. The method according to claim 2, wherein the refractory metal is Hf, Ta or Zr.

4. The method according to claim 1, wherein the metal film formed at the sixth step is a metal alloy.

5. The method according to claim 4, wherein the metal alloy is HfTa or HfTi.

6. The method according to claim 1, wherein the metal film formed at the sixth step is a metal semiconductor alloy.

7. The method according to claim 6, wherein the metal semiconductor alloy is HfSi.

8. The method according to claim 1, wherein the metal film formed at the sixth step is a metal nitride alloy.

9. The method according to claim 8, wherein the metal nitride alloy is TaSiN.

10. The method according to claim 1, wherein the metal film formed at the sixth step is a laminate of at least two different deposited metal materials.

11. The method according to claim 10, wherein the laminate is Hf/SiN/Hf or HfN/AlN/Hf.

12. The method according to claim 1, wherein the annealing at the eighth step is conducted in an oxygen gas environment.

13. The method according to claim 1, wherein the metal film forming at the sixth step is conducted by a sputtering with a metal target of Hf, Zr, Ti, or Ta.

14. The method according to claim 1, wherein the annealing at the eighth step comprises a first annealing conducted in an oxygen gas environment and a second annealing conducted in an inert gas environment.

15. The method according to claim 1, wherein the first and second PVD modules are angled PVD modules.

16. A method of fabricating a metal gate of a transistor in a substrate processing system which comprises a wafer transfer module provided with a transfer unit for transferring a wafer, a thermal annealing module, a cooling module, a first PVD module, and a second PVD module, all of which are respectively connected to the transfer module, the method comprising:
   a first step of transferring a wafer substrate through the wafer transfer module into the thermal annealing module by using the transfer unit;
   a second step of forming an $SiO_2$ film on the wafer substrate in the thermal annealing module;
   a third step of transferring the wafer substrate, on which the $SiO_2$ is formed, through the wafer transfer module into the cooling module by using the transfer unit;
   a fourth step of cooling the wafer substrate, on which the $SiO_2$ is formed, in the cooling module;
   a fifth step of transferring the wafer substrate subjected to the cooling by the fourth step, through the wafer transfer module into the first PVD module by using the transfer unit;
   a sixth step of forming a metal film on the $SiO_2$ film in the first PVD module;
   a seventh step of transferring the wafer substrate, on which the metal film is formed, through the wafer transfer module into the thermal annealing module by using the transfer unit;
   an eighth step of thermally annealing the wafer substrate, on which the metal film is formed, in the thermal annealing module to transform the metal film into a high dielectric film;

a ninth step of transferring the wafer substrate, on which the high dielectric film is formed, through the wafer transfer module into the cooling module by the transfer unit by using the transfer unit;

a tenth step of cooling the wafer substrate, on which the high dielectric film is formed, in the cooling module;

an eleventh step of transferring the wafer substrate subjected to the cooling by the tenth step, through the wafer transfer module into the second PVD module by using the transfer unit; and a twelfth step of forming a metal electrode on the high dielectric film;

wherein the eighth step anneals the metal film at a first temperature in an oxygen gas environment and then further anneals the metal film at a second temperature higher than the first temperature in an inert gas atmosphere environment, and wherein the first step to the twelfth step are sequentially conducted without exposing the formed $SiO_2$ film, formed metal film and formed high dielectric film to an ambient atmosphere by transferring the wafer substrate in a vacuum environment from one module to another module through the wafer transfer module.

17. The metal according to claim 16, wherein the metal film formed at the sixth step contains Hf elements.

18. The method according to claim 16, wherein the sixth step deposits a laminate of at least two different metal materials.

19. The method according to claim 16, wherein a material of the metal film formed at the sixth step is Hf, Ta, Zr, HfN, TaN, TiN, HfTa, HfTa, HfTi, HfSi, or TaSiN.

20. The method according to claim 16, wherein the first and second PVD modules are angled PVD modules.

* * * * *

UNITED STATES PATENT AND TRADEMARK OFFICE
CERTIFICATE OF CORRECTION

| | | |
|---|---|---|
| PATENT NO. | : 7,655,549 B2 | Page 1 of 1 |
| APPLICATION NO. | : 11/347256 | |
| DATED | : February 2, 2010 | |
| INVENTOR(S) | : Sunil et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 295 days.

Signed and Sealed this

Twenty-third Day of November, 2010

David J. Kappos
*Director of the United States Patent and Trademark Office*